(12) United States Patent
Yang et al.

(10) Patent No.: US 10,176,742 B2
(45) Date of Patent: Jan. 8, 2019

(54) ORGANIC LIGHT EMITTING DISPLAY DEVICE, DRIVING METHOD THEREOF AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shengji Yang, Beijing (CN); Xue Dong, Beijing (CN); Hailin Xue, Beijing (CN); Haisheng Wang, Beijing (CN); Hongjuan Liu, Beijing (CN); Yingming Liu, Beijing (CN); Xiaoliang Ding, Beijing (CN); Weijie Zhao, Beijing (CN); Changfeng Li, Beijing (CN); Wei Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 36 days.

(21) Appl. No.: 14/772,234

(22) PCT Filed: Jan. 12, 2015

(86) PCT No.: PCT/CN2015/070527
§ 371 (c)(1),
(2) Date: Sep. 2, 2015

(87) PCT Pub. No.: WO2016/041306
PCT Pub. Date: Mar. 24, 2016

(65) Prior Publication Data
US 2016/0293083 A1 Oct. 6, 2016

(30) Foreign Application Priority Data
Sep. 19, 2014 (CN) .......................... 2014 1 0483720

(51) Int. Cl.
G09G 3/20 (2006.01)
G09G 3/32 (2016.01)
(Continued)

(52) U.S. Cl.
CPC ......... G09G 3/2003 (2013.01); G09G 3/2074 (2013.01); G09G 3/32 (2013.01);
(Continued)

(58) Field of Classification Search
CPC ...... G09G 3/32; G09G 3/2003; G09G 3/3225; G09G 3/2074; G09G 2320/0233;
(Continued)

(56) References Cited

U.S. PATENT DOCUMENTS 5,703,436 A * 12/1997 Forrest ................... C09K 11/06
257/E33.056
7,019,717 B2 * 3/2006 Yumoto ................... G09G 3/30
315/169.3
(Continued)

FOREIGN PATENT DOCUMENTS

| CN | 1447629 A | 10/2003 |
|----|-----------|---------|
| CN | 1702725 A | 11/2005 |

(Continued)

OTHER PUBLICATIONS

International Search Report and Written Opinion dated Apr. 24, 2015; PCT/CN2015/070527.
(Continued)

*Primary Examiner* — Christopher E Leiby
(74) *Attorney, Agent, or Firm* — Ladas & Parry LLP

(57) ABSTRACT

There are provided an organic light emitting display device, a driving method thereof and a display apparatus. The organic light emitting display device includes an underlay substrate, and organic light emitting pixel units arranged in a matrix on the underlay substrate; wherein the respective
(Continued)

organic light emitting units comprise at least two organic light emitting structures which have different light emitting colors, are disposed in cascades and insulated from each other, and a pixel circuit connected corresponding to the organic light emitting structures and configured to drive the organic light emitting structures to emit light. Since the respective organic light emitting pixel units comprise at least two organic light emitting structures which have different light emitting colors, are disposed in cascades, and are insulated from each other, when displaying, each organic light emitting pixel unit can display, in different frame pictures, grey scale effects of at least two colors according to applied signals. The display effect can be raised because each organic light emitting pixel unit can display more colors.

19 Claims, 6 Drawing Sheets

(51) Int. Cl.
  *H01L 27/32*   (2006.01)
  *G09G 3/3225*   (2016.01)
  *G09G 3/3233*   (2016.01)

(52) U.S. Cl.
  CPC ......... *G09G 3/3225* (2013.01); *G09G 3/3233* (2013.01); *H01L 27/32* (2013.01); *G09G 2300/0452* (2013.01); *G09G 2300/0465* (2013.01); *G09G 2300/0814* (2013.01); *G09G 2300/0819* (2013.01); *G09G 2300/0861* (2013.01); *G09G 2310/0262* (2013.01); *G09G 2310/0297* (2013.01); *G09G 2320/0233* (2013.01); *G09G 2320/043* (2013.01); *G09G 2320/045* (2013.01)

(58) Field of Classification Search
  CPC ..... G09G 2320/045; G09G 2300/0465; G09G 2300/0452; G09G 2300/0819; H01L 27/32
  See application file for complete search history.

(56) References Cited

U.S. PATENT DOCUMENTS

| | | | | |
|---|---|---|---|---|
| 7,750,875 B2* | 7/2010 | Kim | ................... | G09G 3/3233 345/82 |
| 9,460,650 B2* | 10/2016 | Hong | ................... | G09G 3/32 |
| 2003/0103022 A1* | 6/2003 | Noguchi | ............. | G09G 3/3233 345/77 |
| 2003/0117348 A1* | 6/2003 | Knapp | ................. | G09G 3/3233 345/76 |
| 2004/0066139 A1 | 4/2004 | Hamada et al. | | |
| 2004/0129933 A1* | 7/2004 | Nathan | ................ | G09G 3/3233 257/40 |
| 2004/0196235 A1* | 10/2004 | Koyama | ............. | G09G 3/3607 345/89 |
| 2004/0222746 A1* | 11/2004 | Winters | ............... | G09G 3/3233 315/167 |
| 2004/0233140 A1* | 11/2004 | Jo | .......................... | G09G 3/325 345/76 |
| 2004/0263499 A1* | 12/2004 | Tanada | .................... | G09G 3/30 345/204 |
| 2005/0243077 A1* | 11/2005 | Chung | ................. | G09G 3/3258 345/204 |
| 2005/0259051 A1* | 11/2005 | Lee | ...................... | G09G 3/3233 345/76 |
| 2005/0264550 A1* | 12/2005 | Ohshima | ............. | G09G 3/3233 345/204 |
| 2005/0285508 A1* | 12/2005 | Murayama | .......... | H01L 27/3211 313/503 |
| 2007/0182317 A1 | 8/2007 | Kido et al. | | |
| 2009/0189834 A1 | 7/2009 | Ohshima et al. | | |
| 2012/0019498 A1* | 1/2012 | Jeong | .................. | G09G 3/3233 345/211 |
| 2013/0306969 A1* | 11/2013 | Park | .................. | H01L 29/41733 257/57 |
| 2014/0292623 A1* | 10/2014 | Moon | .................... | G09G 3/006 345/82 |
| 2014/0361958 A1* | 12/2014 | Cho | ....................... | H01L 51/524 345/76 |
| 2015/0070339 A1* | 3/2015 | Ahn | ..................... | G09G 3/3233 345/211 |

FOREIGN PATENT DOCUMENTS

| | | |
|---|---|---|
| CN | 104269429 A | 1/2015 |
| JP | 11-329745 A | 11/1999 |
| JP | 2002-313571 A | 10/2002 |
| JP | 2004-179142 A | 6/2004 |
| JP | 2007-057667 A | 3/2007 |

OTHER PUBLICATIONS

Second Chinese Office Action dated Dec. 30, 2016; Appln. No. 201410483720.8.

First Chinese Office Action dated Aug. 2, 2016; Appln. No. 201410483720.8..

* cited by examiner

ORGANIC LIGHT EMITTING DISPLAY DEVICE, DRIVING METHOD THEREOF AND DISPLAY APPARATUS

TECHNICAL FIELD

The present disclosure relates to an organic light emitting display device, a driving method thereof and a display apparatus.

BACKGROUND

An organic light emitting diode (OLED) display device is one of hot topics in the research field of flat panel display. Compared with a liquid crystal display, the OLED display device has advantages of low power consumption, low production cost, self-luminescent, broad view angle and fast response speed and so on. At present, in the flat panel display field such as mobile phone, PDA and digital camera and the like, the OLED display device has taken the place of the traditional LCD display screen.

The configuration of the OLED display device mainly comprises: an underlay substrate. Light emitting of the organic light emitting pixel unit OLED display device manufactured on the underlay substrate is realized as follows: a voltage is applied between an anode and a cathode by a pixel circuit, holes in the anode and electrons in the cathode are composite at an organic light emitting layer to produce excitons; the excitons are migrated under the effect of electric fields to deliver energy to luminescent molecules in the light emitting layer and excite electrons in the luminescent molecules to leap from a stationary state to a an excitation state, and the excitation state energy produces photons through radiated leaping.

Unlike that LCD controls the luminance by using a stable voltage, OLED pertains to current-driving, and a stable current is required to control light emitting. Due to manufacturing processes, device aging and so on, non-uniformity exists in a threshold voltage $V_{th}$ of a driving transistor in the most traditional 2T1C pixel circuit, thereby resulting in that a change occurs in the current flowing through OLED of each pixel point to cause the displaying luminance to be non-uniform, which influences display effect of the entire image, such that phenomenon of non-uniformity occurs in the OLED devices of difference areas.

At present, in order to compensate for non-uniformity of the threshold voltage of the driving transistor in the pixel circuit, the number of thin film transistors and capacitors is increased in the pixel circuit, and threshold voltage drift of the driving transistor in the pixel circuit is offset by mutually matching between the thin film transistors and the capacitors. However, the increase of the number of the thin film transistors and the capacitors in the pixel circuit would cause the reduction of the pixel size to be limited greatly, thereby influencing the display effect of pixels.

Therefore, in the case that there are a large number of thin film transistors in the pixel circuit in the existing organic light emitting display device, how to raise the display effect of the pixels becomes a focus of respective manufacturers.

SUMMARY

Given that, there are provided in embodiments of the present disclosure an organic light emitting display device, a driving method thereof and a display apparatus, which are used to raise the display effect of pixels of the organic light emitting display device.

Therefore, there is provided an organic light emitting display device in an embodiment of the present disclosure, comprising an underlay substrate, and organic light emitting pixel units arranged in a matrix on the underlay substrate;

respective organic light emitting units comprise at least two organic light emitting structures which have different light emitting colors, are disposed in cascades, and are insulated from each other, and a pixel circuit connected corresponding to respective organic light emitting structures and configured to drive the organic light emitting structures to emit light.

Optionally, in order to control the respective organic light emitting structures in the organic light emitting pixel units to emit light respectively, in the organic light emitting display device provided in the embodiment of the present disclosure, the number of the organic light emitting structures in the respective organic light emitting pixel units can be equal.

Exemplarily, the organic light emitting display device further comprises: data lines corresponding to organic light emitting pixel units in respective columns or organic light emitting pixel units in respective rows, wherein the number of the data lines is the same as the number of the organic light emitting structures in corresponding organic light emitting pixel unit.

Optionally, the respective organic light emitting structures in the same organic light emitting pixel unit are connected to a corresponding pixel circuit through a corresponding selecting switch respectively.

Data lines corresponding to the same organic light emitting pixel unit can be connected to different pixel circuits in the organic light emitting pixel units respectively.

Respective selecting switches receive corresponding control signals for controlling turn-on or turn-off of the respective selecting switches respectively.

Optionally, in order to simplify the configuration, in the organic light emitting display device provided in the embodiment of the present disclosure, the respective organic light emitting structures in the same organic light emitting pixel unit are connected to a same pixel circuit through a corresponding selecting switch respectively;

The respective selecting switches receive corresponding control signals for controlling turn-on or turn-off of the selecting switches respectively.

Further, in the organic light emitting display device provided in the embodiment of the present disclosure, the respective selecting switches are switching transistors;

Gates of the switching transistors receive corresponding control signals, sources thereof are connected to corresponding pixel circuits, and drains thereof are connected to corresponding organic light emitting structures.

Optionally, in the organic light emitting display device provided in the embodiment of the present disclosure, the respective organic light emitting pixel units comprise three organic light emitting structures; and the three organic light emitting structures emit a red light, a green light and a blue light respectively.

Optionally, in order to simplify the manufacturing process, in the organic light emitting display device provided in the embodiment of the present disclosure, a cascaded sequence of the organic light emitting structures having different light emitting colors in the respective organic light emitting pixel units is the same.

Optionally, in order to simplify the configuration, in the organic light emitting display device provided in the embodiment of the present disclosure, the organic light emitting structure comprises an anode, a light emitting layer and a cathode disposed in cascades sequentially;

Potentials at cathodes of the respective organic light emitting structures in the same organic light emitting pixel unit are the same. That is, the respective organic light emitting structures in each of the organic light emitting pixel units share a cathode signal input terminal, so that a number of cathode signal input terminals inputting signals to the cathodes in the organic light emitting display device can be reduced.

Further, in order to compensate for current difference caused by non-uniformity and drift of the threshold voltage of the driving transistor in the pixel circuit as well as the non-uniformity of OLED effectively, in the organic light emitting display device provided in the embodiment of the present disclosure, the pixel circuit particularly comprises: a driving transistor, a first switching transistor, a second switching transistor, a third switching transistor, a fourth switching transistor, a fifth switching transistor and a capacitor;

wherein a source of the first switching transistor is connected to a reference voltage terminal, a drain thereof is connected to a gate of the driving transistor, and a gate thereof is connected to a first control signal;

a gate of the second switching transistor receives a first scan signal, a drain thereof is connected to a source of the driving transistor, and a source thereof receives a data voltage signal;

a gate of the third switching transistor receives a second scan signal, a source thereof is connected to a drain of the driving transistor, and a drain thereof is connected to a corresponding organic light emitting structure;

a source of the fourth switching transistor is connected to the gate of the driving transistor, a drain thereof is connected to the drain of the driving transistor, and a gate thereof receives the first scan signal;

a gate of the fifth switching transistor receives the second scan signal, a source thereof is connected to a power supply voltage, and a drain thereof is connected to the source of the driving transistor; and the capacitor is connected between the reference voltage terminal and the gate of the driving transistor.

Correspondingly, there is further provided in an embodiment of the present disclosure a driving method of the organic light emitting display device, comprising:

receiving a video signal of an image;

determining, according to a color of an image corresponding to a video signal of a current frame image at positions of respective organic light emitting pixel units in the organic light emitting display device, that an organic light emitting structure displaying a corresponding color light in an organic light emitting pixel unit at a corresponding position emits light.

Correspondingly, there is further provided in an embodiment of the present disclosure a display apparatus, comprising the organic light emitting display device provided in the embodiment of the present disclosure.

In the organic light emitting display device, the driving method thereof and the display apparatus provided in the embodiments of the present disclosure, since the respective organic light emitting pixel units comprise at least two organic light emitting structures which have different light emitting colors, are disposed in cascades, and are insulated from each other, when displaying, each organic light emitting pixel unit can display, in different frame pictures, grey scale effects of at least two colors according to applied signals.

DETAILED DESCRIPTION

Specific implementations of an organic light emitting display device, a driving method thereof and a display apparatus provided in embodiments of the present disclosure will be described in detail by combining with accompanying figures.

Shapes and sizes of respective film layers in the figures do not reflect a real proportion of the organic light emitting display device, and are just a partial structure of the organic light emitting display device, and are only used to describe schematically contents of the present disclosure.

Figure 1:
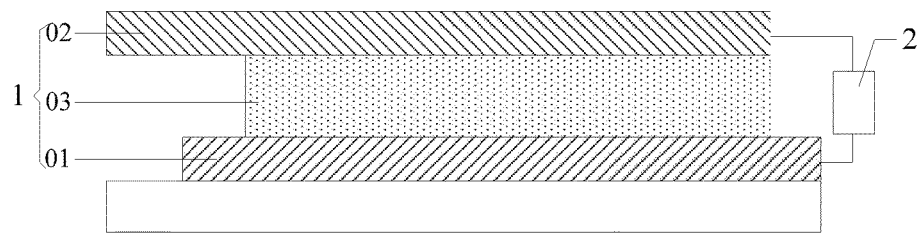
FIG. 1 is a schematic diagram of a configuration of a known organic light emitting pixel unit.

FIG. 1 shows a schematic diagram of a configuration of a known organic light emitting pixel unit. As shown in FIG. 1, the organic light emitting pixel unit comprises: an underlay substrate, and organic light emitting pixel units manufactured on the underlay substrate. Each of the organic light emitting pixel unit comprises an organic light emitting structure 1, and a pixel circuit 2 connected to the organic light emitting structure 1 and configured to drive it to emit light. Specifically, the organic light emitting structure 1 generally comprises an anode 01 and a cathode 02 disposed oppositely, and a light emitting layer 03 arranged between the anode 01 and the cathode 02.

Figure 2:
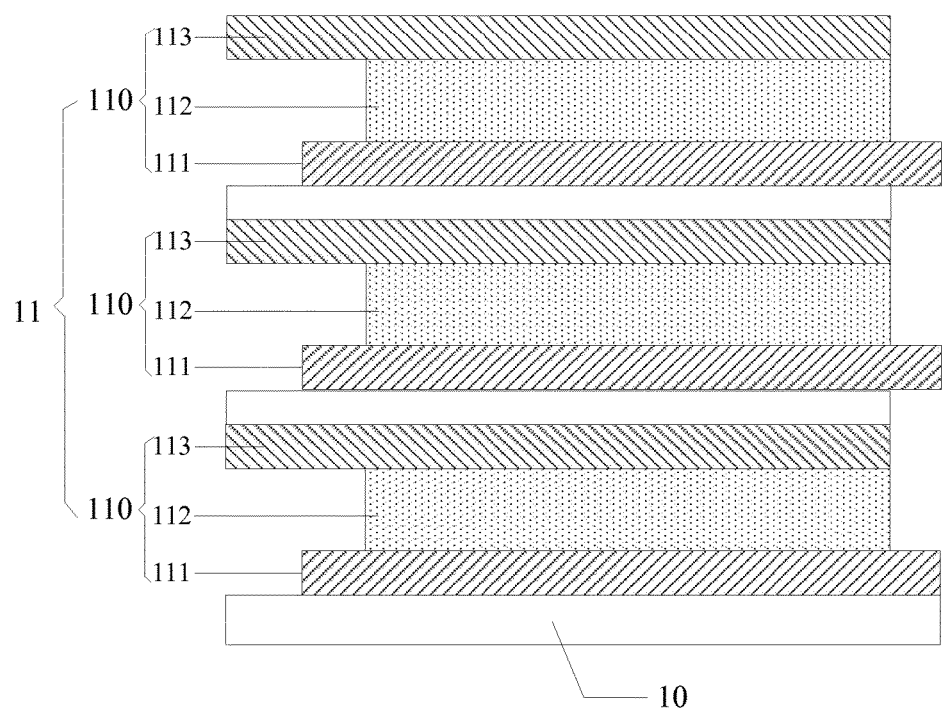
FIG. 2 is a schematic diagram of a configuration of an organic light emitting display device provided in an embodiment of the present disclosure.

FIG. 2 shows a schematic diagram of a configuration of an organic light emitting display device provided in an embodiment of the present disclosure. As shown in FIG. 2, the organic light emitting display device comprises: an underlay substrate 10, and organic light emitting pixel units 11 arranged in matrix on the underlay substrate 10.

The respective organic light emitting units 11 comprise at least two organic light emitting structures 110 which have different light emitting colors, are disposed in cascades and are insulated from each other, and a pixel circuit (not shown in FIG. 2) connected corresponding to the respective organic light emitting structures 110 and configured to drive the organic light emitting structures to emit light.

In the organic light emitting display device provided in the embodiments of the present disclosure, since the respective organic light emitting pixel units comprise at least two organic light emitting structures which have different light emitting colors, are disposed in cascades, and are insulated from each other, in different frame pictures, each organic light emitting pixel unit can display grey scale effects of at least two colors according to applied signals when displaying. Compared with that in the prior art, in different frame pictures, each organic light emitting pixel unit can display only a gray scale effect of one color, the above organic light emitting display device can raise the display effect because each organic light emitting pixel unit can display more colors.

Specifically, in the organic light emitting display device provided in the embodiment of the present disclosure, the more the number of the organic light emitting structures in the respective organic light emitting pixel units, the better the displaying effect would be. However, the more the number of the organic light emitting structures is, the thicker the thickness of the organic light emitting display device would be. Therefore, in the practical application, the number of the organic light emitting structures in the respective organic light emitting pixel units can be determined depending on the display effect and the thickness of the display device.

Further, in the organic light emitting display device provided in the embodiment of the present disclosure, the number of the organic light emitting structures in the organic light emitting pixel circuit may be equal or may be unequal, to which no limitation is made herein.

Optionally, in the organic light emitting display device provided in the embodiment of the present disclosure, the respective organic light emitting pixel units comprise three organic light emitting structures; and the three organic light emitting structures emit a red light, a green light and a blue light respectively.

Further, in the organic light emitting display device provided in the embodiment of the present disclosure, the cascading sequence of the organic light emitting structures having different light emitting colors in the respective organic light emitting pixel units may be same or may be different, to which no limitation is made herein.

Optionally, in order to simplify the manufacturing process, in the organic light emitting display device provided in the embodiment of the present disclosure, the cascading sequence of the organic light emitting structures having different light emitting colors in the respective organic light emitting pixel units can be the same.

Figure 3:
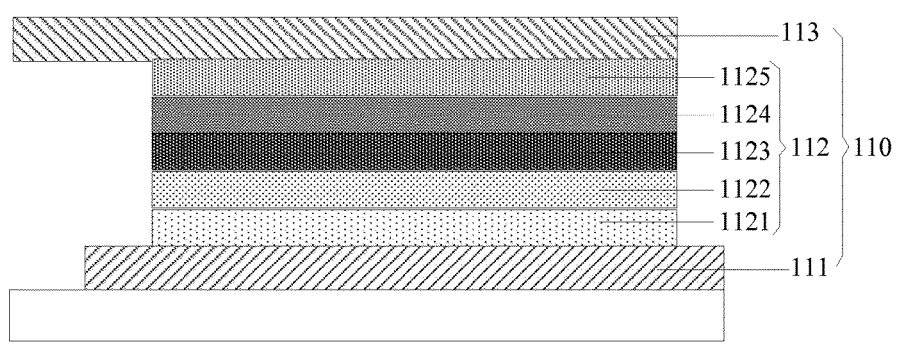
FIG. 3 is a schematic diagram of a configuration of an organic light emitting structure provided in an embodiment of the present disclosure.

FIG. 3 shows a schematic diagram of a configuration of an organic light emitting structure provided in an embodiment of the present disclosure. In the specific implementation, in the organic light emitting display device provided in the embodiment of the present disclosure, as shown in FIGS. 2 and 3, the organic light emitting structure 110 generally comprises an anode 111, a light emitting layer 112 and a cathode 113 disposed in cascades sequentially. Herein, material of the anode is an indium tin oxide (ITO) material in general and material of the cathode is a transparent metal material in general.

Further, in the organic light emitting display device provided in an embodiment of the present disclosure, as shown in FIG. 3, in the organic light emitting structure, the light emitting layer 112 can include film layers such as a hole injection layer 1121, a hole transmission layer 1122, an organic light emitting layer 1123, an electron transport layer 1124 and an electron injection layer 1125 and so on formed by different organic materials respectively. Herein, the hole injection layer 1121 is close to the anode 111 and far away from the cathode 113, and the electron injection layer 1125 is close to the cathode 113 and far away from the anode 111. The organic light emitting structure is well known for those skilled in the art, and thus no further description is given herein.

Optionally, in order to simplify the configuration, in the organic light emitting display device provided in the embodiment of the present disclosure, potentials at the cathodes of the respective organic light emitting structures in the same the organic light emitting pixel unit are equal. That is, the respective organic light emitting structures in each of the organic light emitting pixel units share a cathode signal input terminal, so that the number of the cathode signal input terminals for inputting signals to the cathodes in the organic light emitting display device can be reduced. Of course, in the specific implementation, the potentials at the cathodes of the respective organic light emitting structures in the same organic light emitting pixel units can also be unequal, i.e., being electrically connected to different cathode signal input terminals respectively, to which no limitation is made herein.

Further, in the organic light emitting display device provided in the embodiment of the present disclosure, the potentials at the cathodes of the organic light emitting structures can be a negative voltage or can be zero, to which no limitation is made herein.

Further, in the organic light emitting display device provided in the embodiment of the present disclosure, the number of the organic light emitting structure in the respective light emitting pixel units can be equal. The organic light emitting display device further comprises: data lines corresponding to organic light emitting pixel units in respective columns or organic light emitting pixel units in respective rows, and the number of the data lines is equal to the number of the organic light emitting structures in the corresponding organic light emitting pixel unit.

Figure 4:
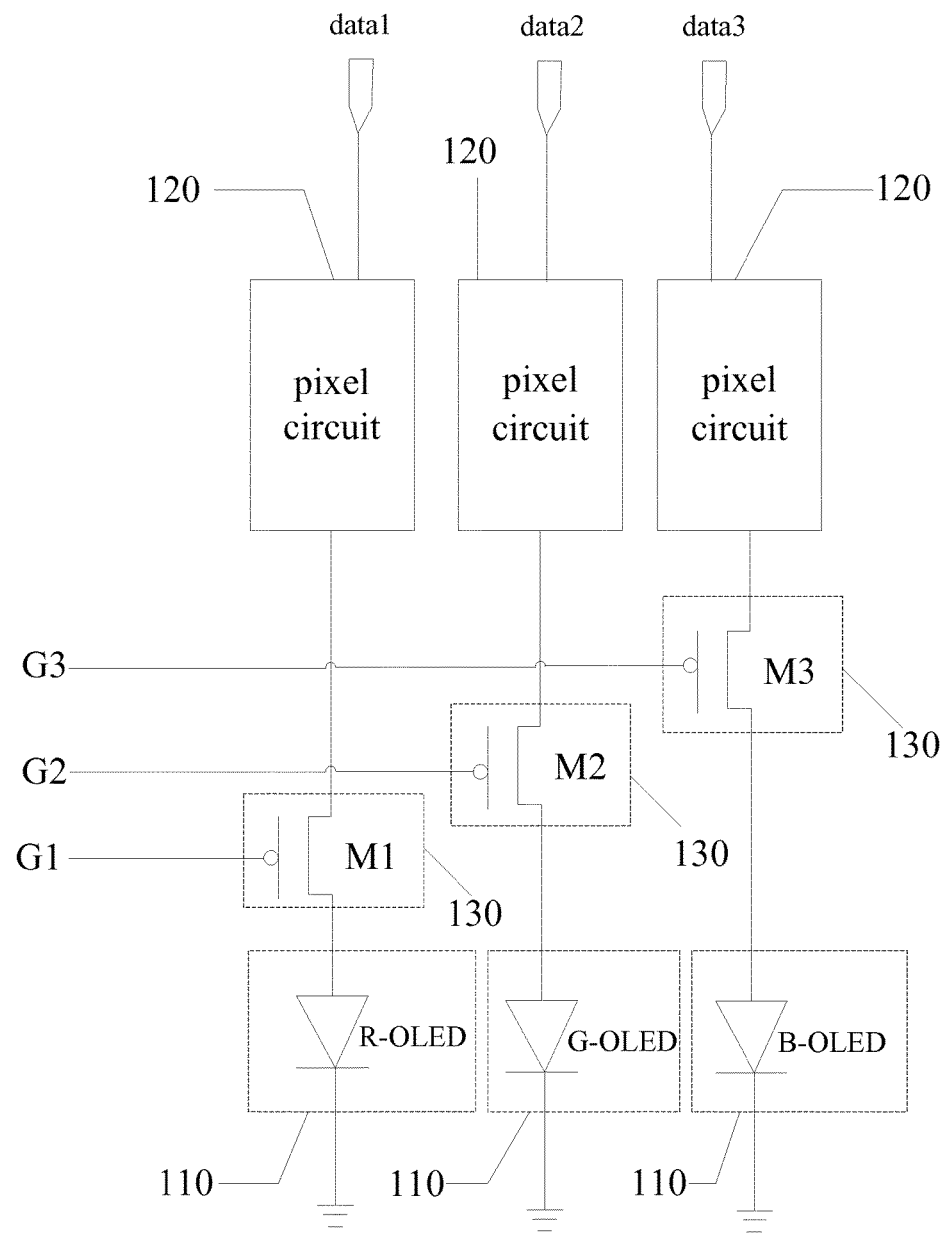
FIG. 4 is one schematic diagram of a configuration of an organic light emitting pixel unit provided in an embodiment of the present disclosure.

FIG. 4 shows a schematic diagram of a configuration of an organic light emitting pixel unit provided in an embodiment of the present disclosure. As shown in FIG. 4, the respective organic light emitting structures 110 in the same organic light emitting pixel unit are connected to a corresponding pixel circuit 120 through a corresponding selecting switch 130 respectively. Data lines corresponding to the same organic light emitting pixel unit are connected to different pixel circuits 120 in the organic light emitting pixel unit respectively. Respective selecting switches 130 receive corresponding control signals for controlling turn-on or turn-off of the respective selecting switches 130 respectively. For example, in FIG. 4, in one organic light emitting pixel unit, an organic light emitting structure R-OLED emitting a red light is connected to a first pixel circuit 120 through one selecting switch 130. The first pixel circuit 120 is connected to a corresponding data line data1, and a corresponding control signal G1 controls turn-on or turn-off of the selecting switch 130. An organic light emitting structure G-OLED emitting a green light is connected to a second pixel circuit 120 through one selecting switch 130. The second pixel circuit 120 is connected to a corresponding data line data2, and a corresponding control signal G2 controls the turn-on or turn-off of the selecting switch 130. An organic light emitting structure B-OLED emitting blue light is connected to a third pixel circuit 120 through one selecting switch 130. The third pixel circuit 120 is connected to a corresponding data line data3, and a corresponding control signal G3 controls the turn-on or turn-off of the selecting switch 130. In this way, in the displaying of each frame picture, the same organic light emitting pixel unit can select the selecting switch that is connected to the organic light emitting structure displaying a corresponding color to be turned on according to the actual color of the current frame image, such that the organic light emitting structure displaying the corresponding color in the organic light emitting pixel unit emits light. Furthermore, since data lines connected to the pixel circuits connected to different organic light emitting structures are different, different data signals can be applied to different pixel circuits according to the current frame image, so as to realize a random display. Therefore, due to the difference of each frame image, the same organic light emitting pixel unit can display gray scale effects of different colors. Compared with that one organic light emitting pixel unit can display only the gray scale effect of one color in the prior art, the above organic light emitting display device can raise the display effect because each organic light emitting pixel unit can display gray scale effects of more colors. In particular, for the organic light emitting display device in which each organic light emitting pixel unit comprises at least the organic light emitting structure emitting the red light, the organic light emitting structure emitting the green light and the organic light emitting structure emitting the blue light, an extreme display effect can be realized. The so-called extreme display effect means that each organic light emitting pixel unit can display any gray scale display effect of RGB (red, green and blue), so that the display effect is raised to the maximum extent.

Figure 5:
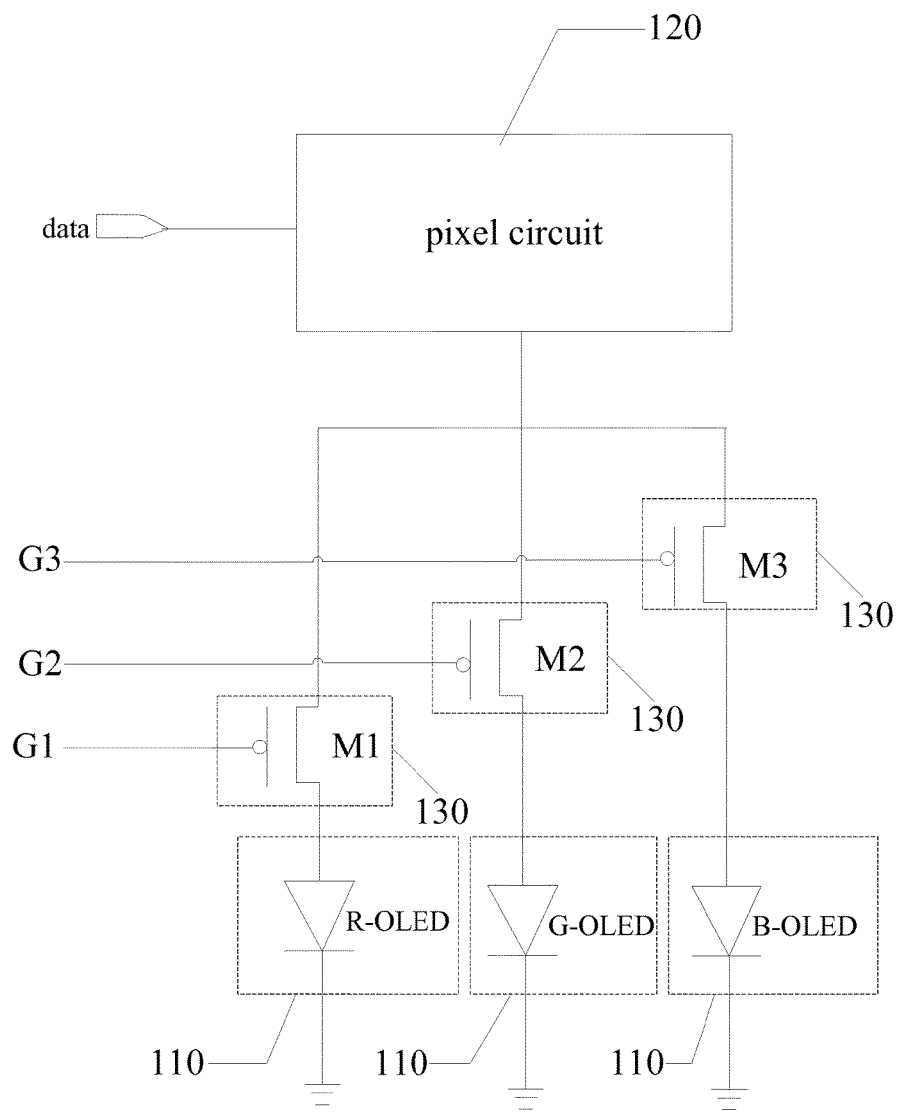
FIG. 5 is another schematic diagram of a configuration of an organic light emitting pixel unit provided in an embodiment of the present disclosure.

FIG. 5 is a schematic diagram of another configuration of an organic light emitting pixel unit provided in an embodiment of the present disclosure. Optionally, as shown in FIG. 5, in order to simplify the configuration, in the organic light emitting display device provided in the embodiment of the present disclosure, the respective organic light emitting structures 110 in the same organic light emitting pixel unit is connected to the same pixel circuit 120 through a corresponding selecting switch 130. The respective selecting switches 130 receive corresponding control signals for controlling the turn-on or turn-off of the respective selecting switches 130 respectively. As such, in the same organic light emitting pixel, only one selecting switch 130 is selected to be turned on when each frame image is displayed. For example, in FIG. 5, in an organic light emitting pixel unit, the organic light emitting structure R-OLED emitting the red light is connected to the pixel circuit 120 through one selecting switch 130, and the corresponding control signal G1 controls the turn-on or turn-off of the selecting switch 130. The organic light emitting structure G-OLED emitting the green light is connected to the pixel circuit 120 through one selecting switch 130, and the corresponding control signal G2 controls the turn-on or turn-off of the selecting switch 130. The organic light emitting structure B-OLED emitting blue light is connected to the pixel circuit 120 through one selecting switch 130, and the corresponding control signal G3 controls the turn-on or turn-off of the selecting switch 130. In general, the pixel circuit 120 in the same organic light emitting pixel unit is connected to a corresponding data line Data. In this way, the same organic light emitting pixel unit can select a selecting switch connected to the organic light emitting structure displaying the corresponding color to be turned on according to the actual color of the current frame image in the display of a frame image, such that the organic light emitting structure displaying the corresponding structure in the organic light emitting pixel unit emits light. In particular, for the organic light emitting display device in which each organic light emitting pixel unit comprises at least the organic light emitting structure emitting the red light, the organic light emitting structure emitting the green light and the organic light emitting structure emitting the blue light, an extreme display effect can be realized.

Further, in the organic light emitting display device provided in the embodiment of the present disclosure, as shown in FIGS. 4 and 5, the selecting switch 130 is a switching transistor. A gate of the switching transistor is connected to a control signal (G1, G2, and G3 in the figure) for controlling the turn-on and turn-off of the switching transistor. A drain of the switching transistor is connected to the corresponding organic light emitting structure 110, and a source thereof is connected to the corresponding pixel circuit 120. As shown in FIGS. 4 and 5, the organic light emitting structure R-OLED emitting the red light is connected to the pixel circuit 102 through the switching transistor M1, and a gate of the switching transistor M1 is connected to the control signal G1. The organic light emitting structure G-OLED emitting the green light is connected to the pixel circuit 120 through the switching transistor M2, and a gate of the switching transistor M2 is connected to the control signal G2. The organic light emitting structure B-OLED emitting the blue green is connected to the pixel circuit 120 through the switching transistor M3, and a gate of the switching transistor M3 is connected to the control signal G3.

Further, in the organic light emitting display device provided in the embodiment of the present disclosure, the pixel circuit has a compensation function and can compensate for the current different caused by non-uniformity and drift of the threshold voltage of the driving transistor in the pixel circuit as well as non-uniformity of OLED effectively. There are many kinds of pixel circuits having the compensation function, to which no limitation is made herein.

The organic light emitting display device provided in the embodiment of the present disclosure will be described through a pixel circuit having the compensation function.

Figure 6:
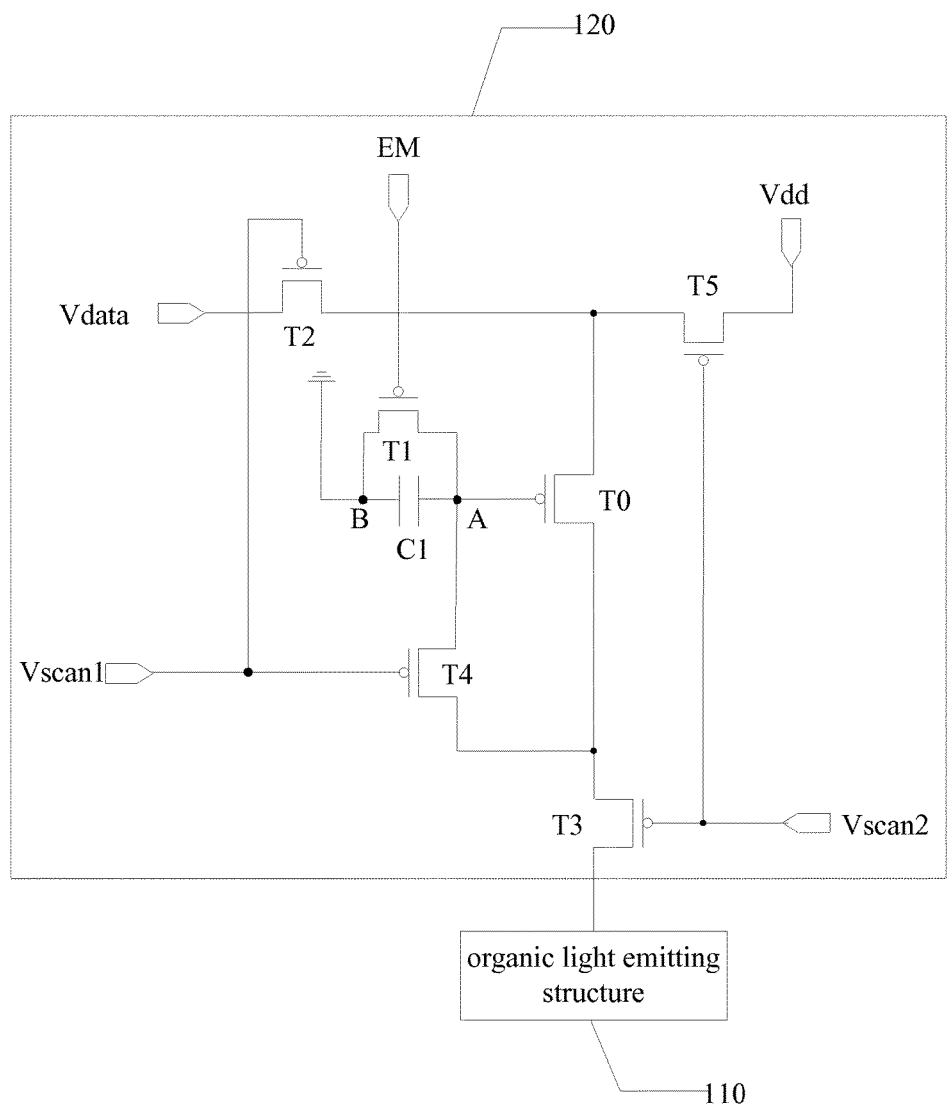
FIG. 6 is a specific circuit schematic diagram of a pixel circuit provided in an embodiment of the present disclosure.

FIG. 6 is a specific circuit schematic diagram of a pixel circuit provided in an embodiment of the present disclosure. As shown in FIG. 6, the pixel circuit 120 can comprise: a driving transistor T0, a first switching transistor T1, a second switching transistor T2, a third switching transistor T3, a fourth switching transistor T4, a fifth switching transistor T5 and a capacitor C1.

In FIG. 6, a source of the first switching transistor T1 is connected to a reference voltage terminal, a drain thereof is connected to a gate of the driving transistor T0, and a gate thereof receives a first control signal EM.

A gate of the second switching transistor T2 receives a first scan signal Vscan1, a drain thereof is connected to a source of the driving transistor T0, and a source thereof receives a data voltage signal $V_{data}$.

A gate of the third switching transistor T3 receives a second scan signal Vscan2, a source thereof is connected to a drain of the driving transistor T0, and a drain thereof is connected to the corresponding organic light emitting structure 110.

A source of the fourth switching transistor T4 is connected to the gate of the driving transistor T0, a drain thereof is connected to the drain of the driving transistor T0, and a gate thereof receives the first scan signal Vscan1.

A gate of the fifth switching transistor T5 receives the second scan signal Vscan2, a source thereof is connected to a power supply voltage $V_{dd}$, and a drain thereof is connected to the source of the driving transistor T0.

The capacitor C1 is connected between the reference voltage terminal and the gate of the driving transistor T0.

Exemplarily, in the specific implementation, in the organic light emitting display device provided in the embodiment of the present disclosure, transistors adopt transistors having the same material generally. All the transistors described above are P type transistors or N type transistors. Herein, the respective N type transistors are turned off at a low level and turned on at a high level, and the respective P type transistors are turned off at the high level and turned on at the low level.

It should be noted that the switching transistors and driving transistor described in the embodiments of the present disclosure can be thin film transistors (TFT), or can be metal oxide semiconductors (MOS), to which no limitation is made herein. Functions of sources and drains of these transistors can be exchanged according to different types of transistors and different input signals, to which no distinction is made.

Figure 7:
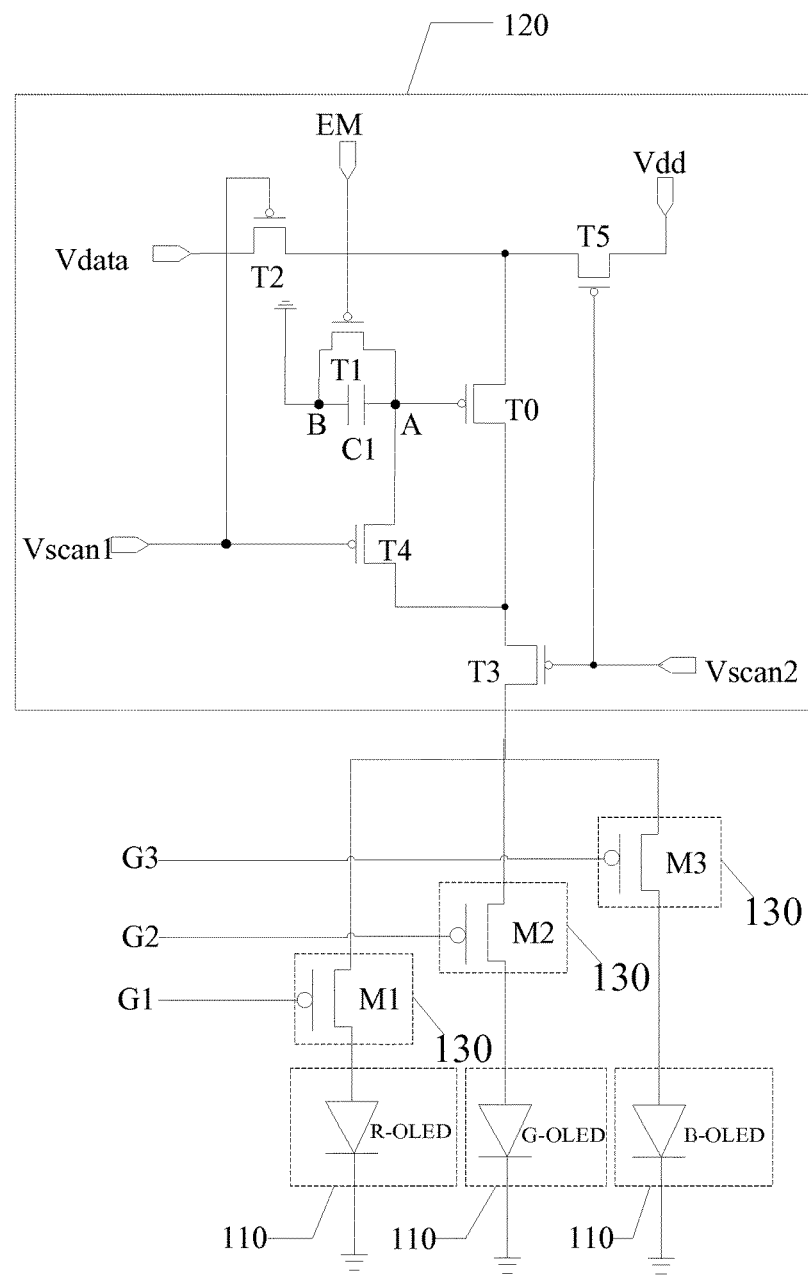
FIG. 7 is a specific circuit schematic diagram of an organic light emitting pixel unit provided in an embodiment of the present disclosure.

FIG. 7 is a specific circuit schematic diagram of an organic light emitting pixel unit provided in an embodiment of the present disclosure. The display process of the organic light emitting display device provided in the embodiment of the present disclosure is described by taking the organic light emitting pixel array as shown in FIG. 5 as an example. Exemplarily, in the organic light emitting pixel array as shown in FIG. 5, the configuration of the pixel circuit 120 is as shown in FIG. 6, the specific circuit of the organic light emitting pixel array is as shown in FIG. 7. In FIG. 7, the driving transistor and all the switching transistors are the P type transistors. A connecting node of the drain of the first switching transistor and the gate of the driving transistor are taken as a first node A, and a connecting node of the capacitor and the reference voltage terminal is taken as a second node B.

Figure 8:
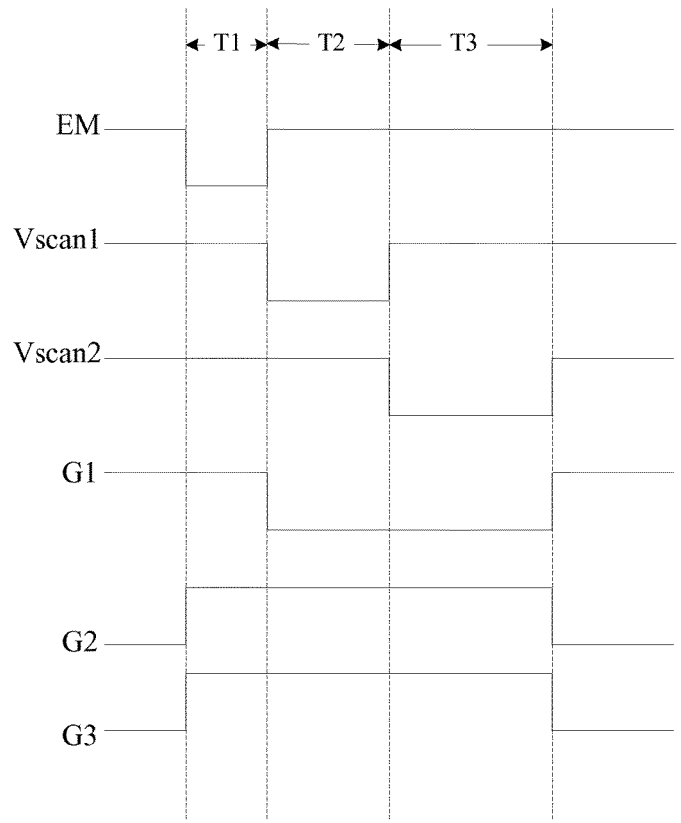
FIG. 8 is a circuit timing diagram of the organic light emitting pixel unit as shown in FIG. 7.

FIG. 8 shows a circuit control timing of the organic light emitting pixel unit as shown in FIG. 7. As shown in FIG. 8, the process of displaying each frame picture of the organic light emitting pixel unit comprises three phases T1~T3. Assuming that in the display of the current frame picture, the organic light emitting structure R-OLED selected to emit the red light is displaying and emitting light, its display process is as follows:

In the phase T1, Vscan1, Vscan2, G1, G2, and G3 are at a high level, and EM is at a low level. Now, the first switching transistor T1 is turned on, T2, T3, T4, T5, M1, M2, and M3 are turned off, the charges stored at the first node A are discharged through T1, and the gate voltage signal of the driving transistor T0 is reset, and the driving transistor T0 is turned on.

In the phase T2, Vscan1 and G1 are at the low level, Vscan2, EM, G2 and G3 are at the high level, the switching transistors T2, T4 and M1 are turned on, T1, T3, T5, M2, M3 are turned off, and the driving transistor T0 remains in the turn-on state continuously. Since T4 is turned on and the gate and drain of the driving transistor T0 are connected, the data signal $V_{data}$ charges the first node A through the driving transistor T0, so that the voltage at the first node A rises until the voltage at the first node A is $V_{data}-V_{th}$. At this time, the charge quantity Q of the capacitor C1 is:

$$Q=C(V_2-V_1)=C \cdot (V_{REF}+V_{th}-V_{data}) \quad (1)$$

Where $V_1$ is the voltage at the first node A at this time, which is equal to $V_{data}-V_{th}$; $V_2$ is the voltage at the second node B at this time, which is equal to a voltage of the reference voltage terminal $V_{REF}$. The reference voltage terminal of the present embodiment is grounded, and the voltage $V_{REF}$ is 0.

In the phase T3, Vscan2 and G1 are at the low level, and Vscan1, EM, G2 and G3 are at the high level, so that the switching transistors T3, T5 and M1 are turned on, T1, T2, T4, M2, M3 are turned off, the capacitor C1 maintains that the gate voltage of the driving transistor T0 is still $V_{data}-V_{th}$, and the source voltage of the driving transistor T0 is a power supply voltage $V_{dd}$. In order to ensure the turn-on of the driving transistor T0 in this phase, it is designed that the power supply voltage $V_{dd}$ is smaller than the data signal voltage $V_{data}$, and the power supply voltage $V_{dd}$ drives B-OLED to emit light, $$V_{gs}=V_s-V_g=V_{dd}+V_{th}-V_{data} \quad (2)$$

The gate-source voltage Vgs of the driving transistor T0 is maintained as $V_{dd}+V_{th}-V_{data}$, and the current of the driving transistor T0 at this time is:

$$I_{OLED} = \frac{1}{2} \cdot \mu_n \cdot Cox \cdot \frac{W}{L} \cdot [V_{dd} - V_{data} + V_{th} - V_{th}]^2 \quad (3)$$
$$= \frac{1}{2} \cdot \mu_n \cdot Cox \cdot \frac{W}{L} \cdot [V_{dd} - V_{data}]^2$$

It can be known from the above equation that the current of the driving transistor T0 is only related with the power supply voltage $V_{dd}$ and the data voltage $V_{data}$, and is unrelated with the threshold voltage $V_{th}$. Therefore, the influence of the non-uniformity and drift of the threshold voltage of the driving transistor and the non-uniformity of the electrical performance of the organic light emitting structure can be eliminated, so that the display effect would be further ensured.

The above embodiment is described by just taking the circuit of the organic light emitting pixel unit as shown in FIG. 7 as an example. For the organic light emitting pixel units having other configurations provided in the embodiment of the present disclosure, the operating principle is the same, and thus no further description is given herein.

Figure 9:
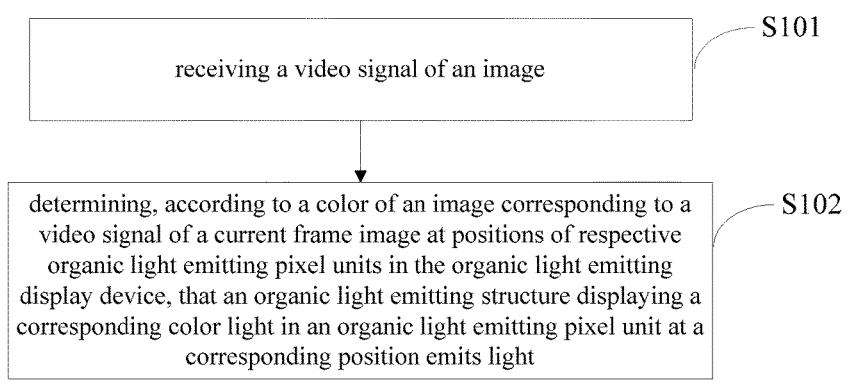
FIG. 9 is a flow diagram of a driving method of an organic light emitting display device provided in an embodiment of the present disclosure.

FIG. 9 shows a flow diagram of a driving method of an organic light emitting display device provided in an embodiment of the present disclosure. As shown in FIG. 9, based on the same disclosed concept, there is further provided a driving method of the organic light emitting display device. The operating process of the method is as follows:

in step S101, receiving a video signal of an image;

in step S102, determining, according to a color of an image corresponding to a video signal of a current frame image at positions of respective organic light emitting pixel units in the organic light emitting display device, that an organic light emitting structure displaying a corresponding color light in an organic light emitting pixel unit at a corresponding position emits light.

In the driving method of the organic light emitting display device provided in the embodiment of the present disclosure, each of the organic light emitting display pixel units can determine, according to the color of the image corresponding to the video signal of the current frame image at positions of the respective organic light emitting pixel units in the organic light emitting display device, that the organic light emitting structure displaying the corresponding color light in the organic light emitting pixel unit at the corresponding position emits light. Therefore, compared with that the organic light emitting pixel unit in the prior art can display only one color, increasing the number of displaying colors of each organic light emitting pixel unit can raise the display effect.

Based on the same disclosed concept, there is further provided in an embodiment of the present disclosure a display apparatus, comprising the organic light emitting display device provided in the embodiment of the present disclosure. The display apparatus can be any product or components having a display function, such as a mobile phone, a tablet computer, a TV set, a display, a notebook computer, a digital photo frame, and a navigator and so on.

For other essential components of the display apparatus, those skilled in the art can understand that the display apparatus should have them, which is not repeated herein and should not be taken as a limitation to the present disclosure. The implementation of the display apparatus can refer to the embodiments of the organic light emitting display device, and thus the repeated description is not given herein.

In the organic light emitting display device, the driving method thereof and the display apparatus provided in the embodiments of the present disclosure, the respective organic light emitting pixel units comprise at least two organic light emitting structures which have different light emitting colors, are disposed in cascades and are insulated from each other; therefore, when displaying, in the different frame pictures, each organic light emitting pixel unit can display grey scale effects of at least two colors according to applied signals. Compared with that in the prior art, in different frame pictures, each of the organic light emitting pixel units can display the gray scale effect of only one color, the organic light emitting display device can raise the display effect because each of the organic light emitting pixel units can display more colors.

Obviously, those skilled in the art can make various alternations and modifications to the embodiments of the present disclosure without departing from the spirit and scope of the present disclosure. As such, if these alternations and modifications to the embodiments of the present disclosure belong to the scope of the claims as well as their equivalent technology, then the present disclosure intends to include these alternations and modifications.

The present application claims the priority of a Chinese patent application No. 201410483720.8 filed on Sep. 19, 2014. Herein, the content disclosed by the Chinese patent application is incorporated in full by reference as a part of the present disclosure.

What is claimed is:

1. An organic light emitting display device, comprising an underlay substrate, and organic light emitting pixel units arranged in a matrix on the underlay substrate;
   wherein each organic light emitting pixel unit comprises
   at least two organic light emitting structures which have different light emitting colors, wherein the at least two organic light emitting structures are disposed in different layers on the underlay substrate, and are insulated from each other, wherein only a single light emitting color is found in each of the different layers, and
   a pixel circuit connected corresponding to the organic light emitting structures and configured to drive the organic light emitting structures to emit light;
   wherein the pixel circuit comprises a driving transistor, a first switching transistor, and a capacitor,
   a source of the first switching transistor is connected to a reference voltage terminal, a drain thereof is connected to a gate of the driving transistor, and a gate thereof is connected to a first control signal;
   a first terminal of the capacitor is connected to the reference voltage terminal without intervention of any transistor and a second terminal of the capacitor is connected to the gate of the driving transistor, wherein the reference voltage terminal is grounded,
   wherein the pixel circuit further comprises: a second switching transistor, a third switching transistor, a fourth switching transistor, and a fifth switching transistor,
   a gate of the second switching transistor is configured to receive a first scan signal, a drain thereof is connected to a source of the driving transistor, and a source is configured to receive a data voltage signal;
   a gate of the third switching transistor is configured to receive a second scan signal, a source thereof is connected to a drain of the driving transistor, and a drain thereof is connected to a corresponding organic light emitting structure;
   a source of the fourth switching transistor is connected to the gate of the driving transistor, a drain thereof is connected to the drain of the driving transistor, and a gate thereof is configured to receive the first scan signal; and
   a gate of the fifth switching transistor is configured to receive the second scan signal, a source thereof is connected to a power supply voltage, and a drain thereof is connected to the source of the driving transistor.

2. The organic light emitting display device according to claim 1, further comprising: data lines corresponding to organic light emitting pixel units in respective columns or organic light emitting pixel units in respective rows, wherein a number of the data lines is the same as that of the organic light emitting structures in the organic light emitting pixel unit;
   the respective organic light emitting structures in a same organic light emitting pixel unit are connected to a corresponding pixel circuit through a corresponding selecting switch respectively;
   data lines corresponding to the same organic light emitting pixel unit are connected to different pixel circuits in the organic light emitting pixel unit respectively; and
   respective selecting switches receive corresponding control signals for controlling turn-on or turn-off of the selecting switches respectively.

3. The organic light emitting display device according to claim 1, wherein the respective organic light emitting structures in the same organic light emitting pixel unit are connected to a same pixel circuit through a corresponding selecting switch respectively; and
   the respective selecting switches receive corresponding control signals for controlling turn-on or turn-off of the respective selecting switches respectively.

4. The organic light emitting display device according to claim 3, wherein the respective selecting switches are switching transistors;
   gates of the switching transistors receive the corresponding control signals, sources thereof are connected to a corresponding pixel circuit, and drains thereof are connected to a corresponding organic light emitting structure.

5. The organic light emitting display device according to claim 1, wherein the respective organic light emitting pixel units comprise three organic light emitting structures; and
   the three organic light emitting structures emit a red light, a green light and a blue light respectively.

6. The organic light emitting display device according to claim 5, wherein a cascaded sequence of the organic light emitting structures having different light emitting colors in the respective organic light emitting pixel units is the same.

7. The organic light emitting display device according to of claim 1, wherein the number of the organic light emitting structures in the respective organic light emitting pixel units is the same.

8. A driving method of an organic light emitting display device according to claim 1, comprising:

receiving a video signal of an image; and determining, according to a color of an image corresponding to a video signal of a current frame image at positions of respective organic light emitting pixel units in the organic light emitting display device, that an organic light emitting structure displaying a corresponding color light in an organic light emitting pixel unit at a corresponding position emits light.

9. A display apparatus, comprising the organic light emitting display device according to claim 1.

10. The organic light emitting display device according to claim 5, further comprising: data lines corresponding to organic light emitting pixel units in respective columns or organic light emitting pixel units in respective rows, wherein a number of the data lines is the same as that of the organic light emitting structures in the organic light emitting pixel unit;

the respective organic light emitting structures in a same organic light emitting pixel unit are connected to a corresponding pixel circuit through a corresponding selecting switch respectively;

data lines corresponding to the same organic light emitting pixel unit are connected to different pixel circuits in the organic light emitting pixel unit respectively; and respective selecting switches receive corresponding control signals for controlling turn-on or turn-off of the selecting switches respectively.

11. The organic light emitting display device according to claim 5, wherein the respective organic light emitting structures in the same organic light emitting pixel unit are connected to a same pixel circuit through a corresponding selecting switch respectively; and the respective selecting switches receive corresponding control signals for controlling turn-on or turn-off of the respective selecting switches respectively.

12. The organic light emitting display device according to claim 11, wherein the respective selecting switches are switching transistors;

gates of the switching transistors receive the corresponding control signals, sources thereof are connected to a corresponding pixel circuit, and drains thereof are connected to a corresponding organic light emitting structure.

13. The display apparatus according to claim 9, further comprising: data lines corresponding to organic light emitting pixel units in respective columns or organic light emitting pixel units in respective rows, wherein a number of the data lines is the same as that of the organic light emitting structures in the organic light emitting pixel unit;

the respective organic light emitting structures in a same organic light emitting pixel unit are connected to a corresponding pixel circuit through a corresponding selecting switch respectively;

data lines corresponding to the same organic light emitting pixel unit are connected to different pixel circuits in the organic light emitting pixel unit respectively; and respective selecting switches receive corresponding control signals for controlling turn-on or turn-off of the selecting switches respectively.

14. The display apparatus according to claim 9, wherein the respective organic light emitting structures in the same organic light emitting pixel unit are connected to a same pixel circuit through a corresponding selecting switch respectively; and the respective selecting switches receive corresponding control signals for controlling turn-on or turn-off of the respective selecting switches respectively.

15. The display apparatus according to claim 14, wherein the respective selecting switches are switching transistors;

gates of the switching transistors receive the corresponding control signals, sources thereof are connected to a corresponding pixel circuit, and drains thereof are connected to a corresponding organic light emitting structure.

16. The display apparatus according to claim 9, wherein the respective organic light emitting pixel units comprise three organic light emitting structures; and the three organic light emitting structures emit a red light, a green light and a blue light respectively.

17. The display apparatus according to claim 16, wherein a cascaded sequence of the organic light emitting structures having different light emitting colors in the respective organic light emitting pixel units is the same.

18. The display apparatus according to claim 9, wherein the organic light emitting structure comprises a anode, a light emitting layer and a cathode disposed in cascades sequentially;

potentials at cathodes in the respective organic light emitting structures in a same organic light emitting pixel units are equal.

19. The organic light emitting display device according to claim 1, wherein the organic light emitting structure comprises a anode, a light emitting layer and a cathode disposed in cascades sequentially, and potentials at cathodes in the respective organic light emitting structures in a same organic light emitting pixel units are equal.

* * * * *